(12) United States Patent
Park et al.

(10) Patent No.: US 8,890,776 B2
(45) Date of Patent: Nov. 18, 2014

(54) DISPLAY DEVICE

(75) Inventors: Jong-Woong Park, Yongin (KR);
Joo-Hyung Lee, Yongin (KR);
Geun-Young Jeong, Yongin (KR);
Byung-Ki Chun, Yongin (KR)

(73) Assignee: Samsung Display Co., Ltd., Yongin, Gyeonggi-Do (KR)

(*) Notice: Subject to any disclaimer, the term of this patent is extended or adjusted under 35 U.S.C. 154(b) by 828 days.

(21) Appl. No.: 12/975,876

(22) Filed: Dec. 22, 2010

(65) Prior Publication Data

US 2011/0291095 A1 Dec. 1, 2011

(30) Foreign Application Priority Data

May 25, 2010 (KR) .................. 10-2010-0048737

(51) Int. Cl.
*H01L 51/52* (2006.01)
*G02F 1/1335* (2006.01)
*H04N 13/04* (2006.01)
*H01L 27/32* (2006.01)

(52) U.S. Cl.
CPC ...... *H04N 13/0409* (2013.01); *G02F 1/133512* (2013.01); *H01L 27/3225* (2013.01); *G02F 2001/133562* (2013.01)
USPC ............................... 345/55; 345/214; 257/59

(58) Field of Classification Search
USPC ............. 345/55, 60, 156, 179, 214; 257/59
See application file for complete search history.

(56) References Cited

U.S. PATENT DOCUMENTS

| 7,359,105 | B2* | 4/2008 | Jacobs et al. | 359/245 |
| 7,612,489 | B2* | 11/2009 | Park et al. | 313/112 |
| 2008/0204368 | A1* | 8/2008 | Han et al. | 345/55 |
| 2009/0141052 | A1* | 6/2009 | Hamagishi | 345/694 |
| 2009/0244387 | A1* | 10/2009 | Lee et al. | 348/674 |

FOREIGN PATENT DOCUMENTS

| JP | 3192994 | | 5/2001 | |
| KR | 10-2007-0001378 | | 1/2007 | |
| KR | 10-2007-0044479 | | 4/2007 | |
| KR | 1020070044479 | * | 4/2007 | ............ G02B 27/22 |
| KR | 10 2008-0000917 A | | 1/2008 | |

* cited by examiner

*Primary Examiner* — Andrew Sasinowski
(74) *Attorney, Agent, or Firm* — Lee & Morse, P.C.

(57) ABSTRACT

A display device including a display panel including a first pixel area and a second pixel area adjacent to the first pixel area; and a barrier positioned on a surface of the display panel, the barrier including: a first sub-barrier; and a second sub-barrier, wherein the first sub-barrier and the second sub-barrier are disposed between the first pixel area and the second pixel area to respectively cover an end of the first pixel area and an end of the second pixel area, in which the first pixel area and the second pixel area display a same first image, or the first pixel area displays any one of a first left-eye image and a first right-eye image and the second pixel area displays the other one of the first left-eye image and the first right-eye image.

17 Claims, 7 Drawing Sheets

DISPLAY DEVICE

CROSS-REFERENCE TO RELATED APPLICATIONS

This application claims priority to and the benefit of Korean Patent Application No. 10-2010-0048737 filed in the Korean Intellectual Property Office on May 25, 2010, the entire contents of which are incorporated herein by reference.

BACKGROUND

1. Field

The described technology relates generally to a display device and more particularly, to a display device implementing stereoscopic images.

2. Description of the Related Art

In general, there are physiological factors and experimental factors related to human recognition of a stereoscopic effect. Three dimensional (3D) image display technologies give objects a stereoscopic effect using binocular parallax, which is the main factor implementing the stereoscopic effect at short distances. In methods using the binocular parallax, there are a stereoscopic method using spectacles and an auto-stereoscopic method not using spectacles.

In the auto-stereoscopic method without using spectacles, in general, the stereoscopic effect is achieved by separating a left-eye image from a right-eye image using a barrier disposed on a display panel. The barrier defines an opaque region and a transparent region repeatedly arranged on the display panel to cover a portion of the display panel, and pixels corresponding to a right eye and pixels corresponding to a left eye are formed on the display panel. In this configuration, an observer may recognize an image displayed on the display panel from the transparent region of the display panel, which is defined by the barrier. The observer may recognize different regions in the display panel with the observer's left and right eyes even if the observer recognizes the same transparent region, such that the observer recognizes a stereoscopic image.

Recently, a technology using a liquid crystal panel as the barrier has been developed. However, using a liquid crystal panel as the barrier increases a thickness of the display panel and makes it less possible to achieve a slim display panel, because the liquid crystal panel is additionally disposed on the display panel, which displays an image.

The above information disclosed in this Background section is only for enhancement of understanding of the background of the described technology and therefore it may contain information that does not form the prior art that is already known in this country to a person of ordinary skill in the art.

SUMMARY

Aspects of the present invention provide a display device having advantages of being thin and able to implement stereoscopic images.

Aspects of the present invention provide a display device including: a display panel including a first pixel area and a second pixel area adjacent to the first pixel area; and a barrier positioned on a surface of the display panel, the barrier including a first sub-barrier and a second sub-barrier, wherein the first sub-barrier and the second sub-barrier respectively cover an end of the first pixel area and an end of the second pixel area such that the first pixel and the second pixel area are interposed between the first sub-barrier and the second sub-barrier, in which the first pixel area and the second pixel area display a same first image, or the first pixel area displays any one of a first left-eye image and a first right-eye image and the second pixel area displays the other one of the first left-eye image and the first right-eye image.

According to another aspect of the present invention, the second pixel area may be disposed along a first direction extending from the first pixel area, and the first sub-barrier and the second sub-barrier may extend in a second direction crossing the first direction.

According to another aspect of the present invention, one or more of the first pixel area and the second pixel area may include a plurality of sub-pixel areas disposed along the second direction.

According to another aspect of the present invention, the display panel may further include a first signal wire corresponding to the first pixel area and covered by the first sub-barrier and a second signal wire corresponding to the second pixel area and covered by the second sub-barrier.

According to another aspect of the present invention, the display panel may further include a third pixel area spaced apart from the first pixel area with the second pixel area disposed between the first pixel area and the second pixel area, and the second sub-barrier may be positioned between the second pixel area and the third pixel area.

According to another aspect of the present invention, the display panel may further include a fourth pixel area spaced apart from the second pixel area with the third pixel area disposed between the first pixel area and the second pixel area, and the barrier may further include a third sub-barrier spaced from the second sub-barrier between the third pixel area and the fourth pixel area and covering an end of the fourth pixel area.

According to another aspect of the present invention, the third pixel area and the fourth pixel area may display a same second image, or the third pixel area may display any one of a second left-eye image and a second right-eye image and the fourth pixel area may display an other one of the second left-eye image or the second right eye-image.

According to another aspect of the present invention, the display panel may further include an organic light emitting diode corresponding to the first pixel area and a substrate covering the organic light emitting diode, and the barrier may be formed directly on a surface of the substrate.

According to another aspect of the present invention, the display panel may further include a liquid crystal layer corresponding to the first pixel area and a substrate covering the liquid crystal layer, and the barrier may be formed directly on a surface of the substrate.

According to aspects of the present invention, it is possible to provide a slim display device that implements a stereoscopic image or a plan image.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION

Reference will now be made in detail to the present embodiments of the present invention, examples of which are illustrated in the accompanying drawings, wherein like reference numerals refer to the like elements throughout. The embodiments are described below in order to explain the present invention by referring to the figures.

As referred to herein, when a first element, item or layer is said to be disposed or formed "on" a second element, item or layer, the first element, item or layer can directly contact the second element, item or layer, or can be separated from the second element, item or layer by one or more other elements, items or layers located therebetween. In contrast, when an element, item or layer is referred to as being disposed or formed "directly on" another element, item or layer, there are no intervening elements, items or layers present. Also, in the drawings, the thickness of layers, films, panels, regions, etc., are exaggerated for clarity. Further, the thickness of some layers and regions are exaggerated in the drawings for better understanding and ease of description.

Figure 1:
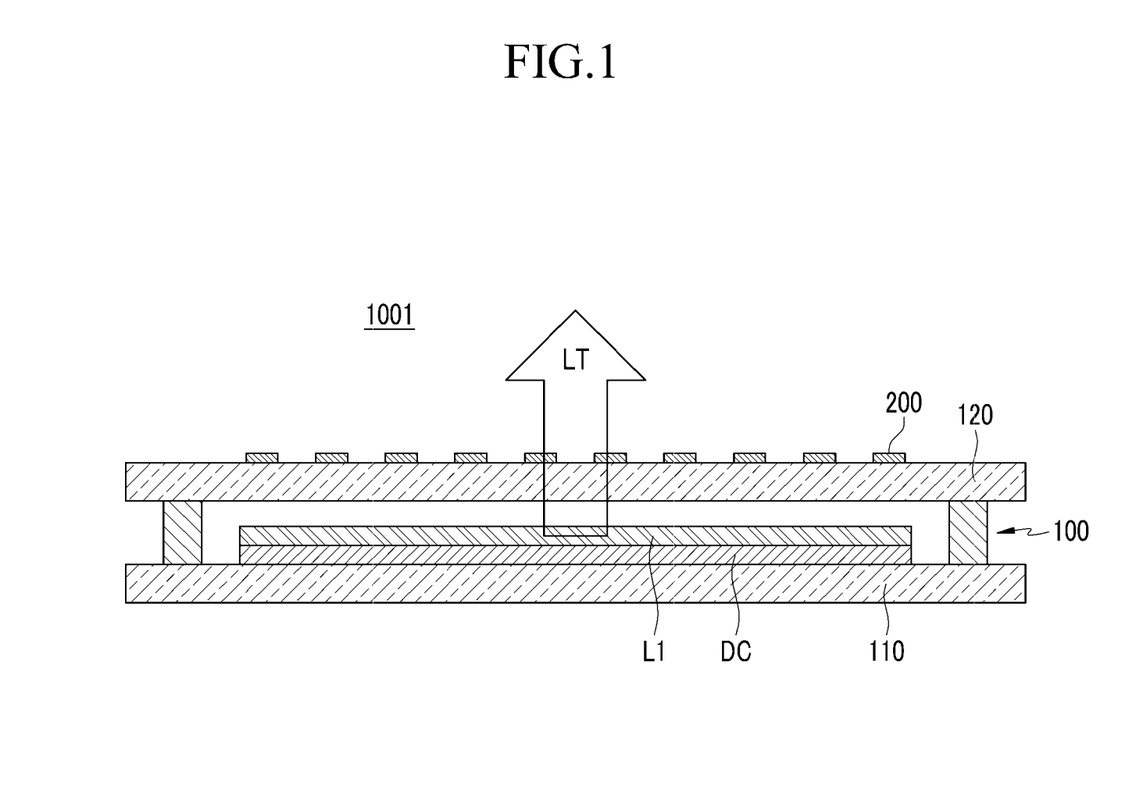
FIG. 1 is a cross-sectional view showing a display device according to an exemplary embodiment.

As shown in FIG. 1, a display device 1001, according to an exemplary embodiment, includes a display panel 100 and a barrier 200. The display panel 100 includes a first substrate 110, a second substrate 120, a driving circuit DC, and an organic light emitting diode (OLED) L1. The first substrate 110 and the second substrate 120 face each other, with the driving circuit DC and the organic light emitting diode L1 disposed therebetween.

Figure 2:
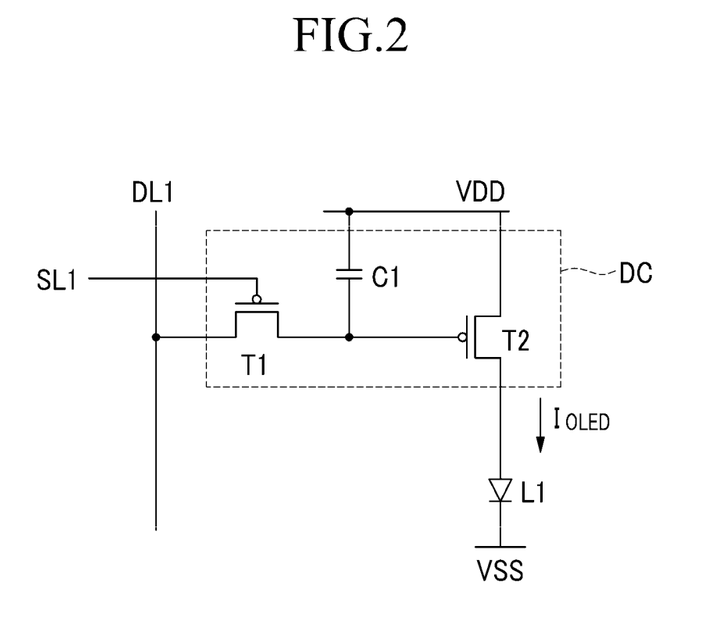
FIG. 2 is a layout view illustrating a circuit arrangement of the driving circuit and the organic light emitting diode (OLED) of the display panel shown in FIG. 1.

The driving circuit DC generally has the arrangement shown in FIG. 2. FIG. 2 is a layout view illustrating a circuit arrangement of the driving circuit DC and the OLED L1 that are shown in FIG. 1.

In detail, as shown in FIG. 2, the driving circuit DC includes two or more thin film transistors, including a switching transistor T1 and a driving transistor T2, and at least one capacitor C1. The switching transistor T1 is connected to a scan line SL1 and a data line DL1 and transmits data voltages inputted from the data line DL1 to the driving transistor T2 in accordance with a switching voltage inputted through the scan line SL1. The capacitor C1 is connected to the switching transistor T1 and a driving power line VDD and stores a voltage corresponding to a difference between the voltage transmitted from the switching transistor T1 and the voltage of the driving power line VDD.

The driving transistor T2 is connected to the driving power line VDD and the capacitor C1. The driving transistor T2 supplies an output current IOLED, which is proportional to a square of the difference between the voltage stored in the capacitor C1 and threshold voltage, to the OLED L1, and the OLED L1 emits light according to the output current IOLED.

The driving transistor T2 includes a source electrode, a drain electrode, and a gate electrode.

The OLED L1 includes an organic emission layer formed between electrodes facing each other. One of the electrodes facing each other is an anode electrode and the other is a cathode electrode. The anode electrode of the OLED L1 is connected to the drain electrode of the driving transistor T2. Furthermore, one or more of the anode electrode and cathode electrode is semi-transmissive in order to reflect and transmit light, or any one of the anode electrode and cathode electrode is reflective in order to reflect light.

The display panel 100 of the display device 1001 displays an image using the organic light emitting diode L1 emitting light LT towards the barrier 200. That is, the display panel 100 is top emission type. The display panel 100 also includes pixel areas PA1, PA2, PA3 and PA4 (see FIG. 3), which are formed at the regions where scan line SL1 and the data line DL1 cross each other. The pixel area is the minimum unit for display an image.

Figure 3:
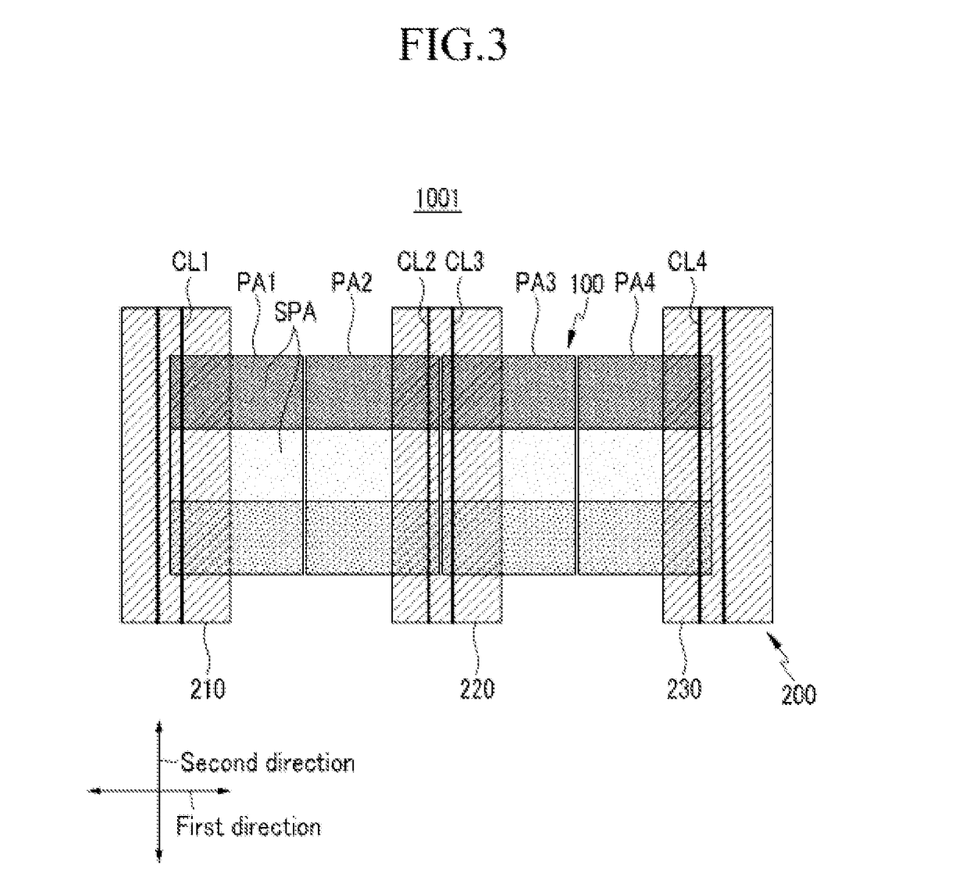
FIG. 3 is a view showing pixel areas in the display device shown in FIG. 1.

As shown in FIG. 3, the pixel areas PA1, PA2, PA3 and PA4 are adjusted to fit a structure of sub-barriers 210, 220, and 230 included in the barrier 200, which are described below. For example, when the sub-barriers 210, 220, and 230 of the barrier 200 are shaped as stripes, an entirety of the pixel areas PA1, PA2, PA3 and PA4 display different images recognizable by the observer's left eye and right eye. The different images correspond to the striped sub-barriers.

Alternatively, the pixel areas PA1, PA2, PA3 and PA4 display a same image recognized by the observer's left and right eyes, such that the observer may recognize a stereoscopic image or a plan image. However, aspects of the present invention are not limited to the configuration describe above, and the configuration of the driving circuit DC and the organic light emitting diode L1 may be modified in various ways known to those skilled in the art to implement well-known configurations.

The barrier 200 is positioned on a surface of the display panel 100 facing the OLED L1. The barrier 200 is formed directly on a surface of the second substrate 120 to cover a portion of the image display on the display panel 100 and is made of a material that blocks light. The barrier 200 is formed by depositing a metal layer on the surface of the second substrate 120. The metal layer is patterned by a photolithography method, or by applying a resin layer containing a light shield material and photosensitive material, such as chrome (Cr), to the surface of the second substrate 120 and the exposing or developing the resin layer. However, aspects of the present invention are not limited thereto, and other suitable methods may be used to pattern the metal layer, and the resin layer may include other suitable materials.

As described above, when the barrier 200 is formed directly on the surface of the second substrate 120, an entire thickness of the display device 1001 decreases as compared with a conventional display device 1001 having a barrier is spaced apart from a barrier. Thus, the display device 1001 is thin. Additionally, as described above, the barrier 200 is formed to correspond to the structure of the pixel areas PA1, PA2, PA3 and PA4 (see FIG. 3).

The structure of the pixel areas PA1, PA2, PA3 and PA4 and the barrier 200 are described hereafter in detail with reference to FIG. 3. FIG. 3 is a view showing pixel areas in the display device shown in FIG. 1. FIG. 3 shows only some regions of the display device for a purpose of better understanding and ease of description. As shown in FIG. 3, the display panel 100 includes a first pixel area PA1, a second pixel area PA2, a third pixel area PA3, and a fourth pixel area PA4. The first pixel area PA1, the second pixel area PA2, and the fourth pixel area PA4 are minimum units displaying an image.

The first pixel area PA1 is adjacent to the second pixel area PA2, the third pixel area PA3 is spaced apart from the first pixel area PA1 with the second pixel area PA2 disposed between the first and third pixel areas PA1 and PA3. The fourth pixel area PA4 is spaced apart from the second pixel area PA2 with the third pixel area PA3 disposed between the fourth and second pixels areas PA4 and PA2, and the third pixel area PA3 is adjacent to the fourth pixel area PA4. That is, the second pixel area PA2, the third pixel area PA3, and the fourth pixel area PA4 is sequentially disposed along a first direction starting from the first pixel area PA1. The first pixel area PA1, the second pixel area PA2, the third pixel area PA3, and the fourth pixel area PA4 include a plurality of sub-pixel areas SPA, which are disposed along a second direction crossing the first direction. One or more of the sub-pixel areas SPA display one color from among the colors red, green, and blue. The first pixel area PA1, the second pixel area PA2, the third pixel area PA3, and the fourth pixel area PA4 each display an image of the minimum unit, using a mixed color of the colors displayed by the sub-pixel areas SPA respectively disposed in each of the pixel areas PA1 to PA4.

The barrier 200 is disposed on the pixel areas PA1 through PA4 to cover a portion of each of the pixel areas PA1 to PA4. The barrier 200 includes a first sub-barrier 210 covering a portion of the first pixel area PA1, a second sub-barrier 220 covering a portion of each of the second pixel area PA2 and the third pixel area PA3, and a third sub-barrier 230 covering a portion of the fourth pixel area PA4. The first sub-barrier 210, the second sub-barrier 220, and the third sub-barrier 230 are spaced apart from each other along the first direction, and each extend along the second direction crossing the first direction. That is, the first sub-barrier 210, the second sub-barrier 220, and the third sub-barrier 230 each have a striped shape. Thus, the barrier 200 of the display device 1001, according to the present exemplary embodiment, has a striped shape. However, aspects of the present invention are not limited thereto and a barrier 200 may have various suitable shapes, such as checkers and a stepped shape or other suitable shapes.

The first sub-barrier 210 covers a first end of the first pixel area PA1. The second sub-barrier 220 covers a second end of the second pixel area PA2 which is opposite to a first end of second pixel area PA2, the first end of the second pixel area PA2 being adjacent to a second end of the first pixel area PA1 which is not covered by the first sub-barrier 210. The second sub-barrier 220 also covers a first end of the third pixel area PA3 which is adjacent to the second end of the second pixel area PA2. The third sub-barrier 230 covers a second end of the fourth pixel area PA4 which is opposite to a first end of the fourth pixel area PA4, the first end of the fourth pixel area PA4 being adjacent to a second end of the third pixel area PA3 which is not covered by the second sub-barrier 220. That is, the first sub-barrier 210 and the second sub-barrier 220 are spaced apart from each other such that ends of the first pixel area PA1 and the second pixel area PA2 are disposed between the first sub-barrier 210 and the second sub-barrier 220. Additionally, the second sub-barrier 220 and the third sub-barrier 230 are spaced apart from each other such that ends of the third pixel area PA3 and the fourth pixel area PA4 are disposed between the second sub-barrier 220 and the third sub-barrier 230.

As described above, the regions, or ends of the pixels areas PA1 through PA4, respectively covered by the first sub-barrier 210, the second sub-barrier 220, and the third sub-barrier 230 are opaque regions. The regions, or ends of the pixel areas PA1 through PA4, respectively disposed between the first sub-barrier 210, the second sub-barrier 220 and the third sub-barrier 230 are transparent regions. As such, when the first pixel area PA1 and the second pixel area PA2 display a same first image and the third pixel area PA3 and the fourth pixel area PA4 display a same second image, the observer's left eye and the right eye recognize the first image displayed by the transparent region between the first sub-barrier 210 and the second sub-barrier 220 and the second image displayed by the transparent region between the second sub-barrier 220 and the third sub-barrier 230. As a result, a plan image displayed by the display device 1001 is recognizable to the observer.

Furthermore, when the first pixel area PA1 displays any one of the first left-eye image and the first right-eye image, the second pixel area PA2 displays another one of the first left-eye image and the first right-eye image. Also, when the third pixel area PA3 displays any one of the second left-eye image and the second right-eye image, the fourth pixel area PA4 displays the other one of the first left-eye image and the first right-eye image. Thus, the observer's left eye and right eye may recognize the first left-eye image and the first right-eye image, respectively. The first left-eye image and the first right-eye image have inter-disparity with respect to the transparent region between the first sub-barrier 210 and the second sub-barrier 220. The observer's left eye and right eye may also recognize the second left-eye image and the second right-eye image, respectively, which have inter-disparity with respect to the transparent region between the second sub-barrier 220 and the third sub-barrier 230. As a result, the observer recognizes a stereoscopic image from the display device 1001.

As described above, the display device 1001 allows the observer to selectively recognize the plan image or the stereoscopic image displayed on the display device 1001. The plan image and the stereoscopic image are displayed in accordance with a type of image displayed in the first pixel area PA1, the second pixel area PA2, the third pixel area PA3, and the fourth pixel area PA4. That is, the display device 1001 can selectively implement the plan image or the stereoscopic image.

Furthermore, the barrier 200 covers a portion of each of the pixel areas PA1 through PA4 in which signal wires are positioned. A first signal wire CL1 transmits a signal to the first pixel area PA1 and is positioned at portion of the first pixel area PA1 corresponding to the first sub-barrier 210. A second signal wire CL2 transmits a signal to the second pixel area PA2 and a third signal wire CL3 transmits a signal to the third pixel area PA3. The second and third signal wires CL2 and CL3 are respectively positioned at portions of the second and third pixel areas PA2 and PA3 corresponding to the second sub-barrier 220. A fourth signal wire CL4 transmits a signal to the fourth pixel area PA4 and is positioned at a portion of the fourth pixel area PA4 corresponding to the third sub-barrier 230. That is, the first through fourth signal wires CL1 through CL4 are positioned to correspond to the barrier 200 and are covered by the barrier 220 such that they are not recognizable from outside of the display device 1001. The first signal wire CL1, the second signal wire CL2, the third signal wire CL3, and the fourth signal wire CL4 may form the driving circuit DC described above or may be any one or more of the scan line SL1, the data line DL1, and the driving power line VDD.

As described above, in the display device 1001, the first signal wire CL1, the second signal wire CL2, the third signal wire CL3, and the fourth signal wire CL4 respectively transmit signals to the first pixel area PA1, the second pixel area PA2, the third pixel area PA3, and the fourth pixel area PA4. Also, the first through fourth signal wires CL1 through CL4 are covered by the barrier 200 and are not recognizable from an outside of the display device 1001, such that visibility of the image displayed by the display device 1001 is improved and a display quality of the display device 1001 is improved.

Figure 4:
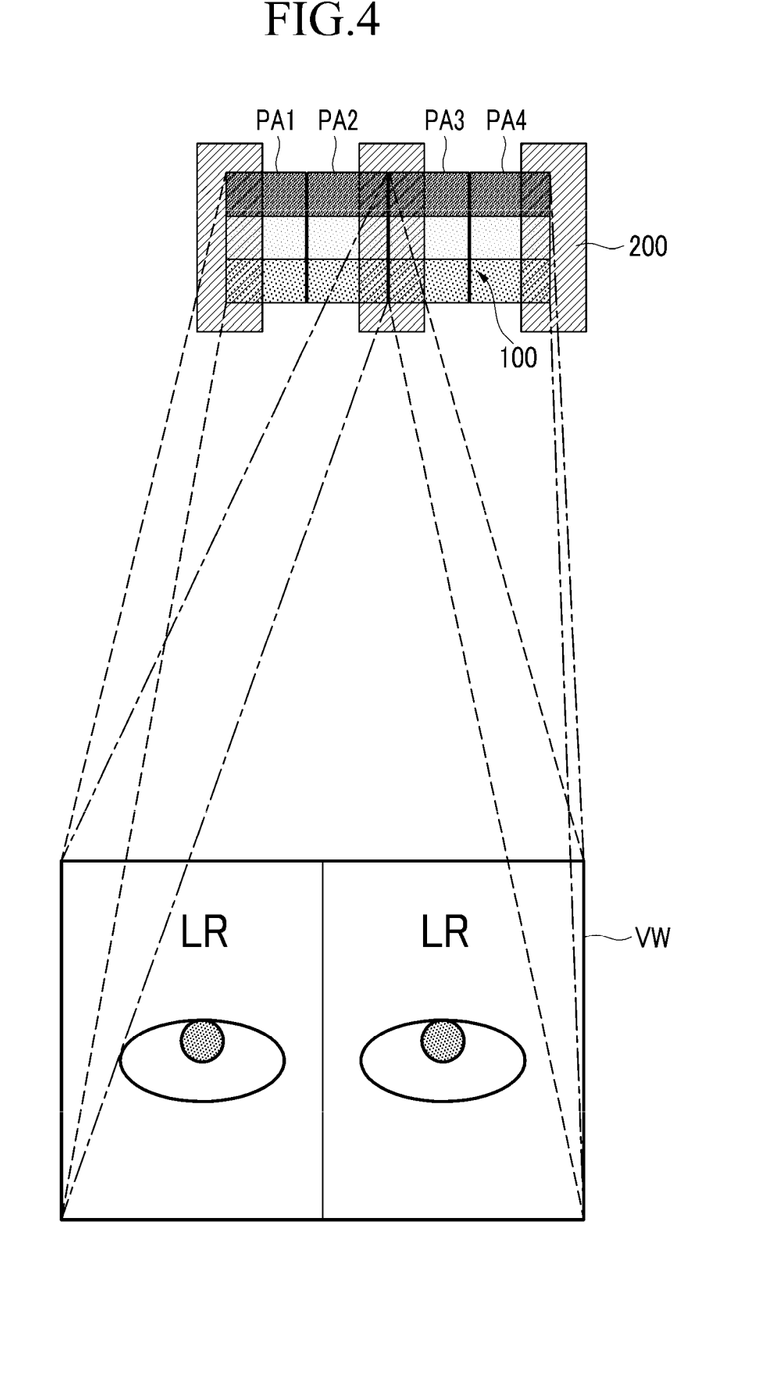
FIG. 4 is a view illustrating an observer recognizing a plan image from the display device according to the exemplary embodiment of FIG. 1.
Figure 5:
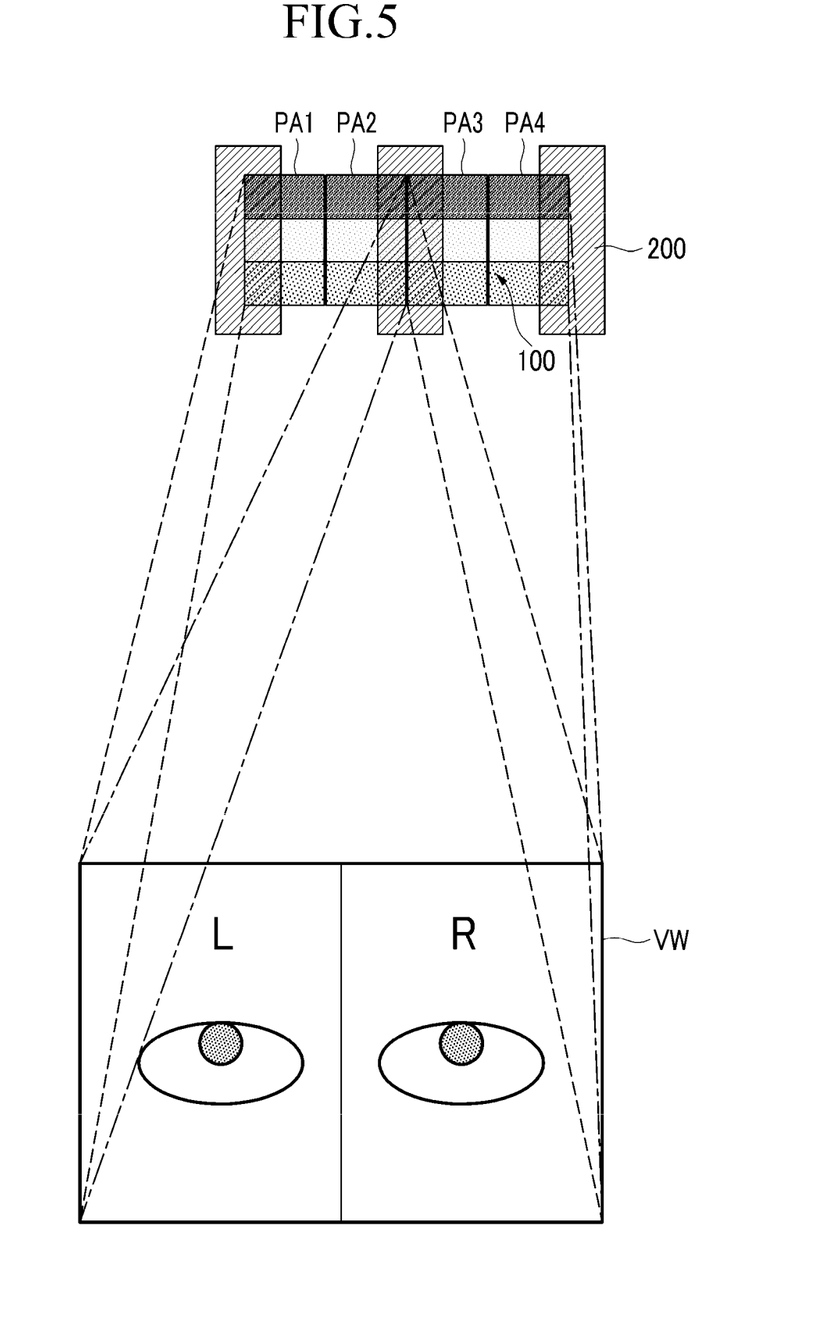
FIG. 5 is a view illustrating an observer recognizing a stereoscopic image from the display device according to the exemplary embodiment of FIG. 1.

FIG. 4 is a view illustrating that observer recognizing a plan image displayed by the display device 1001 according to the exemplary embodiment of FIG. 1. FIG. 5 is a view illustrating that observer recognizing a stereoscopic image displayed by the display device 1001 according to the exemplary embodiment of FIG. 1.

First, when the display device 1001 implements the plan image, as shown in FIG. 4, by displaying the same first image is displayed in the first pixel area PA1 and the second pixel area PA2 and the same second image is displayed in the third pixel area PA3 and the fourth pixel area PA4. In such a case, the observer's left eye and right eye may recognize the first image displayed by the transparent region between the first sub-barrier 210 and the second sub-barrier 220 and the second image displayed by the transparent region between the second sub-barrier 220 and the third sub-barrier 230. Thus, at a predetermined distance from the display device 1001, an image displayed on a virtual viewing window VW is reflected equally towards the observer's left eye and right eye. As a result, the observer recognizes the plan image displayed by the display device 1001.

Next, when the display device 1001 displays a stereoscopic image, as shown in FIG. 5, and when the first right-eye image is displayed in the first pixel area PA1, the first left-eye image is displayed in the second pixel area PA2, the second right-eye image is displayed in the third pixel area PA3, and the second left-eye image is displayed in the fourth pixel area PA4. In such a case, the observer's left eye recognizes the first left-eye image displayed by the second pixel area PA2, which is displayed through the transparent region disposed between the first sub-barrier 210 and the second sub-barrier 220. Also, the observer's right eye recognizes the first right-eye image displayed by the first pixel area PA1, which is displayed through the transparent region disposed between the first sub-barrier 210 and the second sub-barrier 220. As such, the image displayed on the virtual viewing window VW, at a predetermined distance from the display device 1001, is reflected to the observer's left eye and right eye, respectively. As a result, the observer may recognize the stereoscopic image displayed by the display device 1001. In this configuration, the observer's left eye may recognize the second left-eye image displayed by the fourth pixel area PA4, which is displayed through the transparent region disposed between the second sub-barrier 220 and the third sub-barrier 230. Also, the observer's right eye may recognize the first right-eye image displayed by the third pixel area PA3, which is displayed through the transparent region disposed between the second sub-barrier 220 and the third sub-barrier 230. As a result, the observer may recognize a stereoscopic image displayed by the display device 1001.

As described above, the display device 1001, according to the present exemplary embodiment, has a slim shape due to forming the barrier 200 directly on the surface of the second substrate 120. Also, the display device 1001 has an improved display quality due to covering the wires, which include the signal wires CL1 through CL4, with the barrier 200 such that the wires are not recognizable from the outside of the display device 1001, while selectively implementing the plan image or the stereoscopic image.

Figure 6:
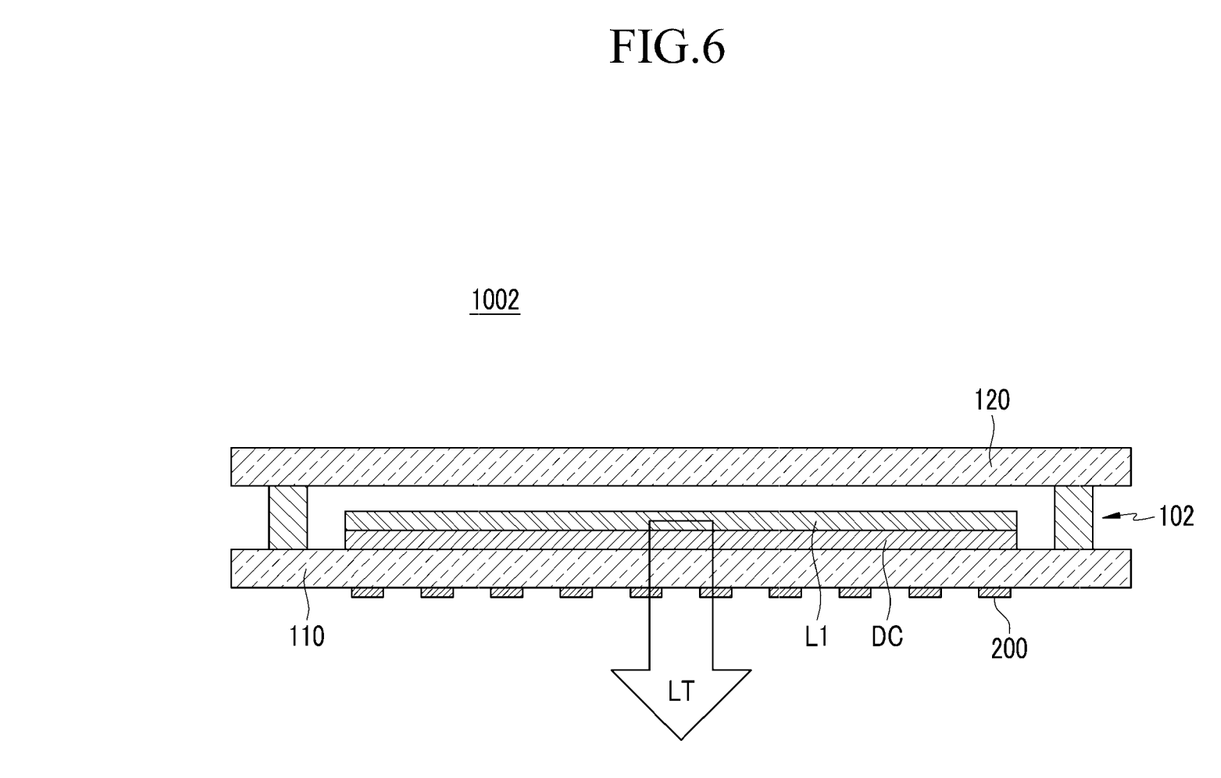
FIG. 6 is a cross-sectional view showing a display device according to another exemplary embodiment.

FIG. 6 is a cross-sectional view showing a display device 1002 according to another exemplary embodiment. As shown in FIG. 6, a barrier 200 included in the display device 1002 is formed on a surface of a first substrate 110 and an OLED L1 of a display panel 102 emits light LT towards the first substrate 110, that is, towards the barrier 200, in order to display an image. That is, the display panel 102 is a bottom emission type. The display device 1002 also includes a second substrate 120.

As described above, the display device 1002 has a slim shape due to forming the barrier 200 directly on the surface of the first substrate 110. Additionally, the display device 1002 has an improved display quality due to covering the wires, including the signal wires CL1 through CL4, with the barrier 200 such that the wires are not recognizable from outside of the display device 1002, while selectively implementing the plan image or the stereoscopic image.

Figure 7:
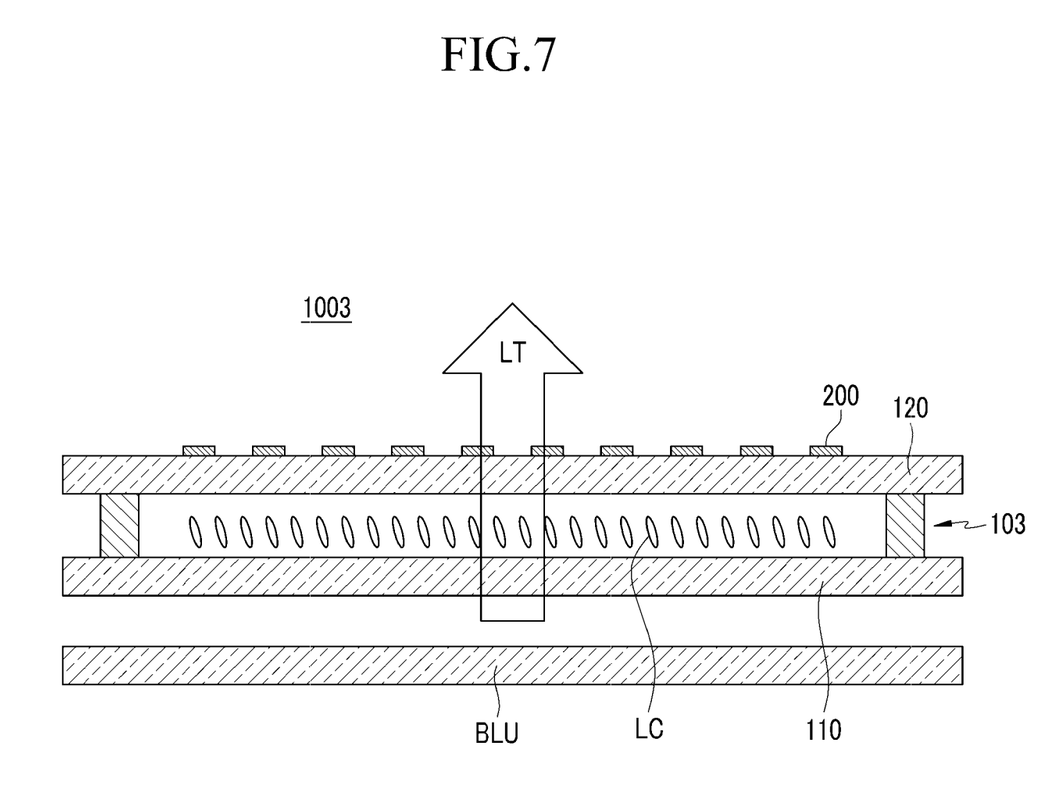
FIG. 7 is a cross-sectional view showing a display device according to another exemplary embodiment.

FIG. 7 is a cross-sectional view showing a display device 1003 according to another exemplary embodiment. As shown in FIG. 7, the display device 1003 includes a display panel 103, a barrier 200, and a backlight unit BLU.

The display panel 103 includes a first substrate 110 and a second substrate 120 facing each other. A liquid crystal layer LC is disposed between the first substrate 110 and the second substrate 120. The display panel 103 displays an image using light LT emitted from the backlight unit BLU, which is transmitted through the liquid crystal layer LC. Wires are formed on at least one of the first substrate 110 and the second substrate 120. Some of the wires are positioned to correspond to a barrier 200 formed on the second substrate 120 covering the liquid crystal layer LC. The wires are covered by the barrier 200 so as to not be recognizable from outside of the display device 1003. Liquid crystals contained in the liquid crystal layer LC are moved by a magnetic field generated by the wires. As such, an amount of light LT emitted from the backlight unit BLU towards the display panel 103 is controlled, and as a result, an image is displayed on the display panel 103. Furthermore, the light LT travels through the barrier 200, which is formed on the surface of the second substrate 120, to be emitted from the display panel 103 and is recognizable as an image to an observer.

As described above, the display device 1003, according to the present exemplary embodiment, has a slim shape due to the barrier 200 being directly on the surface of the second substrate 120. Also, the display device 1003 has an improved display quality due to covering the wires, which include the signal wires CL1 through CL4, with the barrier 200 such that the wires are not recognizable from outside of the display device 1002, while selectively implementing the plan image or the stereoscopic image.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A display device comprising:
   a display panel including a first pixel area and a second pixel area adjacent to the first pixel area; and
   an opaque barrier positioned on a surface of the display panel, the barrier comprising:
   a first sub-barrier; and
   a second sub-barrier,
   wherein the first sub-barrier and the second sub-barrier respectively cover an end of the first pixel area and an end of the second pixel area such that the first pixel area and the second pixel area are interposed between the first sub-barrier and the second sub-barrier,
   wherein the first pixel area and the second pixel area display a same first image, or the first pixel area displays any one of a first left-eye image and a first right-eye image and the second pixel area displays the other one of the first left-eye image and the first right-eye image, wherein the display panel further comprises a third pixel area spaced apart from the first pixel area, the second pixel area being disposed between the first pixel area and the third pixel area, and wherein the second sub-barrier is positioned to overlap only adjacent ends of the second pixel area and the third pixel area.

2. The display device of claim 1, wherein:
the first and second pixel areas are transparent regions immediately adjacent to each other along a first direction, and
longitudinal directions of the first sub-barrier and the second sub-barrier extend in a second direction crossing the first direction.

3. The display device of claim 2, wherein one or more of the first pixel area and the second pixel area include a plurality of sub-pixel areas disposed adjacent to each other along the second direction.

4. The display device of claim 3, wherein the display panel further comprises:
a first signal wire corresponding to the first pixel area and covered by the first sub-barrier; and
a second signal wire corresponding to the second pixel area and covered by the second sub-barrier.

5. The display device of claim 1, wherein the display panel further comprises a fourth pixel area spaced apart from the second pixel area, the third pixel area being disposed between the fourth pixel area and the second pixel area, and
wherein the barrier further comprises a third sub-barrier spaced apart from the second sub-barrier and disposed to cover an end of the fourth pixel area.

6. The display device of claim 5, wherein the third pixel area and the fourth pixel area display a same second image, or the third pixel area displays any one of a second left-eye image and a second right-eye image and the fourth pixel area displays one of the second left-eye image and the second right-eye image.

7. The display device of claim 1, wherein the display panel further comprises:
an organic light emitting diode corresponding to the first pixel area; and
first and second substrates facing each other, the organic light emitting diode being between the first and second substrates,
wherein the barrier is directly on the first substrate, the barrier being directly on a surface of the first substrate facing away from the organic light emitting diode.

8. The display device of claim 1, wherein the display panel further comprises:
a liquid crystal layer corresponding to the first pixel area; and
first and second substrates facing each other, the liquid crystal layer being between the first and second substrates,
wherein the barrier is directly on the first substrate, the barrier being directly on a surface of the first substrate facing away from the liquid crystal layer.

9. The display device of claim 1, wherein the display device selectively displays one of a flat image and a stereoscopic image,
wherein the flat image is displayed by the first pixel area and the second pixel area displaying the same first image, and wherein the stereoscopic image is displayed by the first pixel area displaying any one of the first left-eye image and the first right-eye image and the second pixel area displaying the other one of the first left-eye image and the first right-eye image.

10. The display device of claim 1, wherein the barrier is a single metal layer directly on a surface of the display panel.

11. A display device comprising:
a first substrate having a surface including a driving circuit driving an organic light emitting element disposed thereon;
a second substrate having a surface facing the first substrate; and
an opaque barrier disposed on an outward facing surface of the first substrate or the second substrate, the barrier comprising:
a first sub-barrier; and
a second sub-barrier,
wherein each of the first substrate and the second substrate include a first pixel area and a second pixel area adjacent to the first pixel area,
wherein the first sub-barrier and the second sub-barrier respectively cover an end of the first pixel area and an end of the second pixel area, such that the first pixel area and the second pixel area are interposed between the first sub-barrier and the second sub-barrier, and
wherein the first pixel area and the second pixel area display a same first image, or the first pixel area displays any one of a first left-eye image and a first right-eye image and the second pixel area displays the other one,
wherein the display panel further comprises a third pixel area spaced apart from the first pixel area, the second pixel area disposed between the first pixel area and the pixel area, and
wherein the second sub-barrier is positioned to overlap only adjacent ends of the second pixel area and the third pixel area.

12. The display device of claim 11, wherein the barrier is disposed on a surface of the second substrate opposite to the surface of the second substrate facing the first substrate.

13. The display device of claim 11, wherein the second pixel area is disposed along a first direction extending from the first pixel area, and
wherein the first sub-barrier and the second sub-barrier extend in a second direction crossing the first direction.

14. The display device of claim 13, wherein one or more of the first pixel area and the second pixel area include a plurality of sub-pixel areas disposed along the second direction.

15. The display device of claim 11, wherein the display panel further comprises:
a first signal wire corresponding to the first pixel area and covered by the first sub-barrier; and
a second signal wire corresponding to the second pixel area and covered by the second sub-barrier.

16. The display device of claim 11, wherein the display panel further comprises a fourth pixel area spaced apart from the second pixel area, the third pixel area being disposed between the fourth pixel area and the second pixel area, and
wherein the barrier further comprises a third sub-barrier spaced apart from the second sub-barrier and disposed to cover an end of the fourth pixel area.

17. The display device of claim 11, wherein the display device selectively displays one of a flat image and a stereoscopic image,
wherein the flat image is displayed by the first pixel area and the second pixel area displaying the same first image, and wherein the stereoscopic image is displayed by the first pixel area displaying any one of the first left-eye image and the first right-eye image and the second pixel area displaying the other one of the first left-eye image and the first right-eye image.

* * * * *